United States Patent [19]

Hart

[11] 4,071,722

[45] Jan. 31, 1978

[54] LATCH AND SWITCH INTERLOCK SAFETY STRUCTURE

[75] Inventor: Terry Jonathan Hart, Long Valley, N.J.

[73] Assignee: Bell Telephone Laboratories, Incorporated, Murray Hill, N.J.

[21] Appl. No.: 719,260

[22] Filed: Aug. 31, 1976

[51] Int. Cl.² ............................................. H01H 9/20
[52] U.S. Cl. ................................... 200/50 A; 361/339
[58] Field of Search ................ 200/16 D, 16 E, 16 F, 200/50 A; 361/331, 338, 339

[56] References Cited

U.S. PATENT DOCUMENTS

| | | |
|---|---|---|
| 2,802,972 | 8/1957 | Warrington ........................ 200/50 R |
| 2,970,243 | 1/1961 | Riesz et al. ............................ 361/338 |
| 3,174,002 | 3/1965 | Golbeck ............................. 200/16 D |
| 3,485,966 | 12/1969 | Bailey et al. ....................... 200/16 D |
| 3,502,825 | 3/1970 | Bailey et al. ....................... 200/16 D |
| 3,932,716 | 1/1976 | Mottel et al. ....................... 200/50 A |

*Primary Examiner*—James R. Scott
*Attorney, Agent, or Firm*—John W. Fisher

[57] ABSTRACT

A latch and switch interlock safety structure includes an electronic circuit module having a switch normally biased in an OFF state. Regardless of the switch state, upon insertion and removal of the module into a support frame, the latch mechanism interacts with the switch interlock to ensure removal of electrical power to the module. Only after the module is properly mated with the frame can the switch be actuated to its ON state.

10 Claims, 7 Drawing Figures

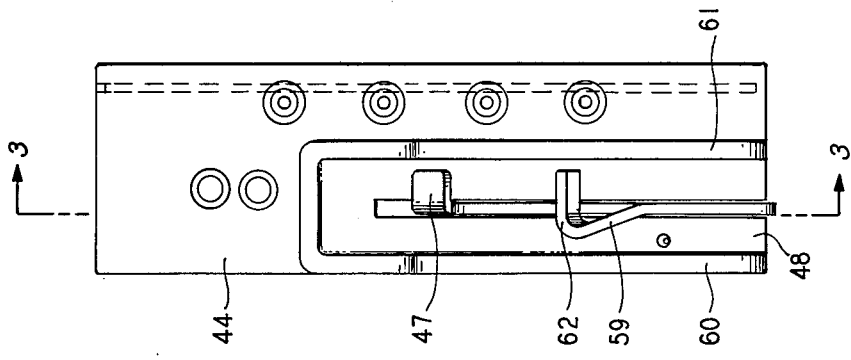
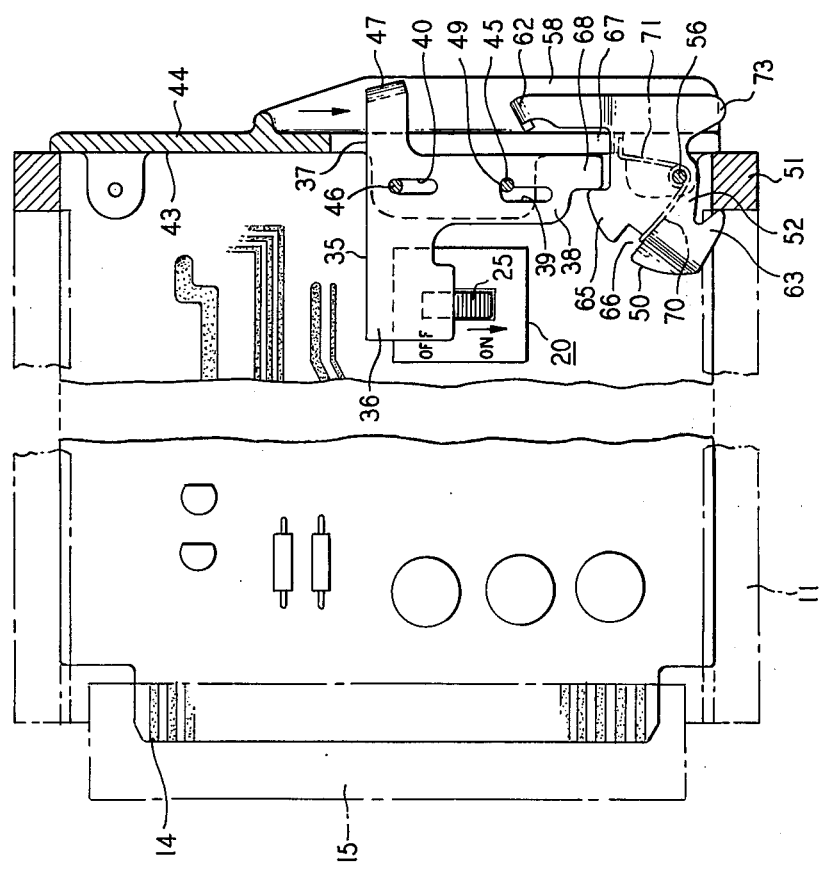

LATCH AND SWITCH INTERLOCK SAFETY STRUCTURE

BACKGROUND OF THE INVENTION

1. Field of the Invention

This invention relates to circuit makers and breakers and, in particular, to an interlocking switch and latch.

2. Description of the Prior Art

Actuator controlled switches to remove electrical power from electronic modules during plug-in and removal from a support frame are known in the art as evidenced by U.S. Pat. No. 3,932,716, issued to S. Mottel et al on Jan. 13, 1976. In the Mottel et al arrangement, a latch and the actuator are pivotally mounted in parallel relation on the module, with the latch engaging a fixed support frame member. During insertion and removal, a lateral extension of the latch engages the actuator to hold the module switch off. When the module is fully engaged, the latch is removably displaced from the actuator whereby the actuator can be pivoted to turn the module switch on and off.

A problem with the above arrangement is that it is possible to remove the module without releasing the latch. Should this occur, the switch continues to be held in the ON state and electrical power continues to be supplied to the module until a complete physical break is made in the connection between the module and the support frame. Failure of the latch and switch interlock, as described, has occurred on numerous occasions in actual field operation with subsequent damage to the connector contacts on the support frame and on the module caused by electrical transients. In addition, failure to prevent electrical power from being supplied to the module until is is properly mated with the connector on the support frame can result in damage to the electronic components carried on the module.

Accordingly, it is one object of the present invention to virtually eliminate contact damage and component failures occasioned by having electrical power supplied to the module during its insertion and removal.

Another object is to ensure the removal of electrical power automatically during module insertion and removal.

A further object of the present invention is to provide a safety interlock arrangement wherein the power switch is normally biased to an OFF state, thereby preventing application of electrical power until the module and support frame connector are properly mated.

Still another object is to have the latch and switch actuator mechanically coupled when the switch is in its ON state such that any attempt to insert or remove a module with the switch in this state automatically breaks the mechanical coupling, permitting the switch bias to return the switch to its OFF state.

SUMMARY OF THE INVENTION

The foregoing and other objects of the invention are realized in an illustrative embodiment of a switch assembly for removing electrical power supplied to an electronic module during insertion and removal of the module with a mating connector on a support frame. Included in the assembly is a switch which is fixedly mouned to the module. This switch has a slidable member which is movable from a first position, wherein the switch is in an OFF state preventing electrical power from being supplied to the module, to a second position, wherein the switch is in an ON state permitting electrical power to be supplied to the module. Apparatus is provided for imparting a positional bias to the switch and this positional bias tends to maintain the switch in its OFF state. Further apparatus is provided for overriding the positional bias and actuating the switch when the module is mated with the connector on the support frame. The overriding apparatus includes a mechanism for holding the switch in its ON state upon actuation. Pivotally mounted on the module is apparatus for latching the module to the support frame. The latching apparatus has provision for engaging the overriding apparatus so that upon insertion and removal of the module the latching apparatus is pivotally rotated, imparting an arcuate motion to the overriding apparatus, releasing the holding mechanism and allowing the positional bias to return the switch to its OFF state.

Accordingly, it is one feature of the present invention that the switch has a positional bias imparted thereto tending to maintain it in its OFF state.

Another feature is that the apparatus for overriding the positional bias includes a mechanism for holding the switch in its ON state upon switch and latch actuation.

Still another feature of the present invention is that the module cannot be inserted and removed from a support frame without the switch being automatically set to its OFF state regardless of its prior state.

Yet another feature is that the latching apparatus and the switch actuator are mechanically coupled to one another during switch actuation in such a way that upon insertion and removal of the module the mechanical coupling is broken and the switch positional bias returns the switch automatically to its OFF state.

A further feature is that the latching apparatus is provided with a positional bias tending to maintain it in a latched state, thereby ensuring proper latching of the module upon insertion into the support frame.

BRIEF DESCRIPTION OF THE DRAWINGS

The aforementioned objects and features of the invention, as well as other objects and features, will be better understood upon consideration of the following detailed description and appended claims taken in conjunction with the attached drawings of an illustrative embodiment in which:

FIG. 3 is a sectional side elevation taken along section line 3—3 of FIG. 4 illustrating the module plugged in with the switch and latch actuated;

FIG. 4 is a front view of FIG. 3;

DETAILED DESCRIPTION

Figure 1:
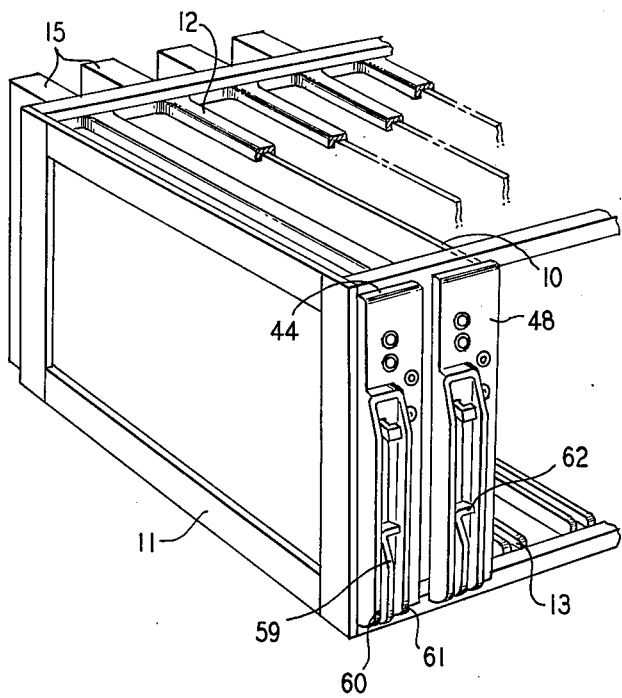
FIG. 1 is a fragmentary orientation view in perspective showing two component modules plugged into a support frame.

In many electronic systems a plurality of electronic circuit modules 10, as shown in FIG. 1, are mounted side-by-side in a support frame 11. Each module 10, at the initiation of insertion, engages upper and lower slide members 12 and 13, respectively, which maintain module 10 in proper orientation so that contact pads 14 along a back edge of module 10, as shown in FIG. 3, engage mating connector 15 at the rear of support frame 11. Electrical power, supplied to operate the electronic circuitry included in module 10, is coupled to module 10 through connector 15 and contact pads 14. Interconnections between modules 10 also are completed through contact pads 14 and connector 15.

Because many electronic systems, designed in accordance with the above description, are subjected to severe shock and vibrational effects, especially in earthquake prone areas, and because these systems must remain operational throughout the duration of these effects, it is desirable to secure module 10 to support frame 11. Moreover, because the application of electrical power to module 10, if it is not properly seated in connector 15, may result in damage to contact pads 14 and the circuit components, it is desirable to have a safety interlock between the latching mechanism and a power control switch. A latch and switch interlock arrangement which meets these objectives is illustrated in FIGS. 2 through 6.

Figure 2:
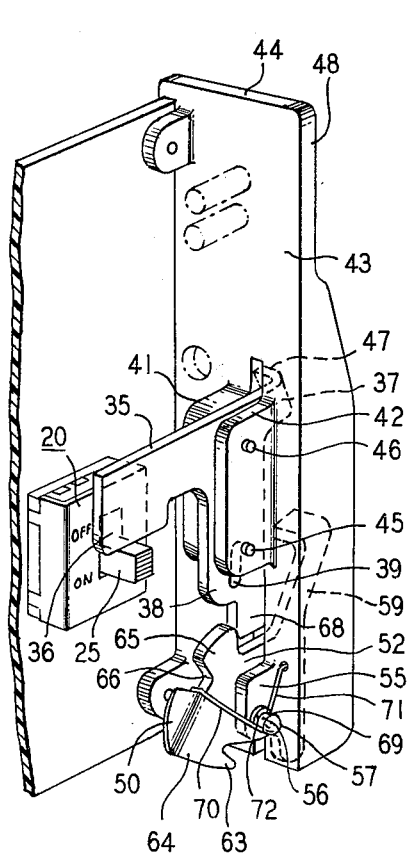
FIG. 2 is a perspective view showing the switch and latch arrangement.
Figure 7:
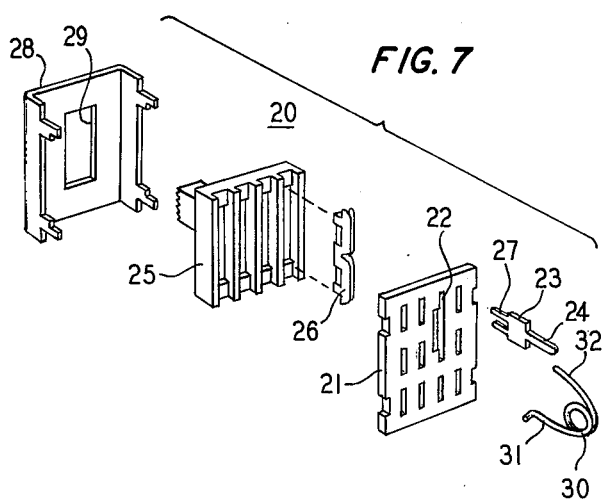
FIG. 7 is an exploded perspective view of the switch showing the apparatus for imparting a positional bias.

Module 10, as shown in FIG. 2, has a switch 20 fixedly mounted thereon. Switch 20, shown in more detail in FIG. 7, includes an insulative support wafer 21 which has an elongated aperture 22 in a central region. A plurality of electrical contacts 23 are fixedly mounted to support wafer 21. Contacts 23 have provision at end 24 for electrically coupling switch 20 to module 10. A slidable member 25 has a plurality of slide contacts 26 which fit over bifurcated tips 27 of contacts 23. Slidable member 25 is movable from a first position, wherein switch 20 is in an OFF state preventing electrical power from being supplied to module 10, to a second position, wherein switch 20 is in an ON state permitting electrical power to be supplied to module 10. When switch 20 is in its OFF state, slide contacts 26 connect first pairs of bifurcated tips 27, and when switch 20 is in its ON state slide contacts 26 connect second pairs of tips 27. A cover member 28 holds slidable member 25 in slidable engagement with support wafer 21. Cover member 28 has a generally rectangular aperture 29 therein for limiting the travel of slidable member 25.

On the underside of switch 20 is a torsion spring 30 which has first and second elongated arms 31 and 32, respectively. Arm 31 engages slidable member 25 whereas arm 32 engages elongated aperture 22 in support wafer 21. Torsion spring 30 imparts a positional bias to switch 20 tending to maintain it in an OFF state.

A switch actuator 35, as shown in FIG. 2, has a generally T-shaped appearance. One arm 36 of the "T" engages slidable switch member 25 and an opposite arm 37 is utilized to faci,itate imparting a downwardly slidable motion to actuator 35. A stem portion 38 of actuator 35 has therein first and second spaced-apart elongated apertures 39 and 40, respectively. Apertures 39 and 40 are axially displaced from one another along an axis of stem 38. Actuator 35 is slidably affixed between projections 41 and 42 on a rear face 43 of module face panel 44 by a pair of pins 45 and 46. Pins 45 and 46 pass through apertures 39 and 40 with the latter guiding actuator 35 during application of slidable motion. Ends of pins 45 and 46 are affixed in projections 41 and 42.

Actuator 35 further has a bend 47 near an end of arm 37, bend 47 being exposed on a front face 48 of module face panel 44. Bend 47 enables an operator to apply a downward pressure to actuator 35. Since arm 36 engages slidable member 25, as the downward pressure is applied, the positional bias of switch 20 is overriden and the switch may be advantageously actuated to its ON state. A detent 49 at the top of aperture 39, upon engaging pin 45, holds switch 20 in its ON state. The foregoing description assumes module 10 is properly mounted in support frame 11 to permit application of electrical power to it. FIG. 3 illustrates this situation.

Figure 5:
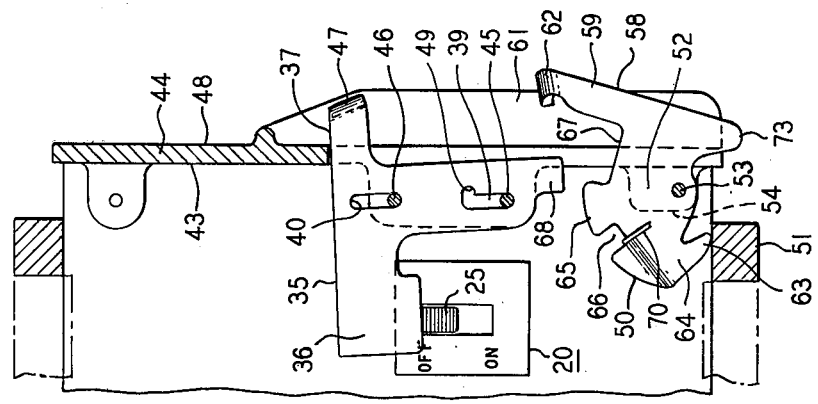
FIG. 5 is a sectional side elevation similar to FIG. 3 but showing the latch tripped, the switch returned to its OFF position, and the module being withdrawn.
Figure 6:
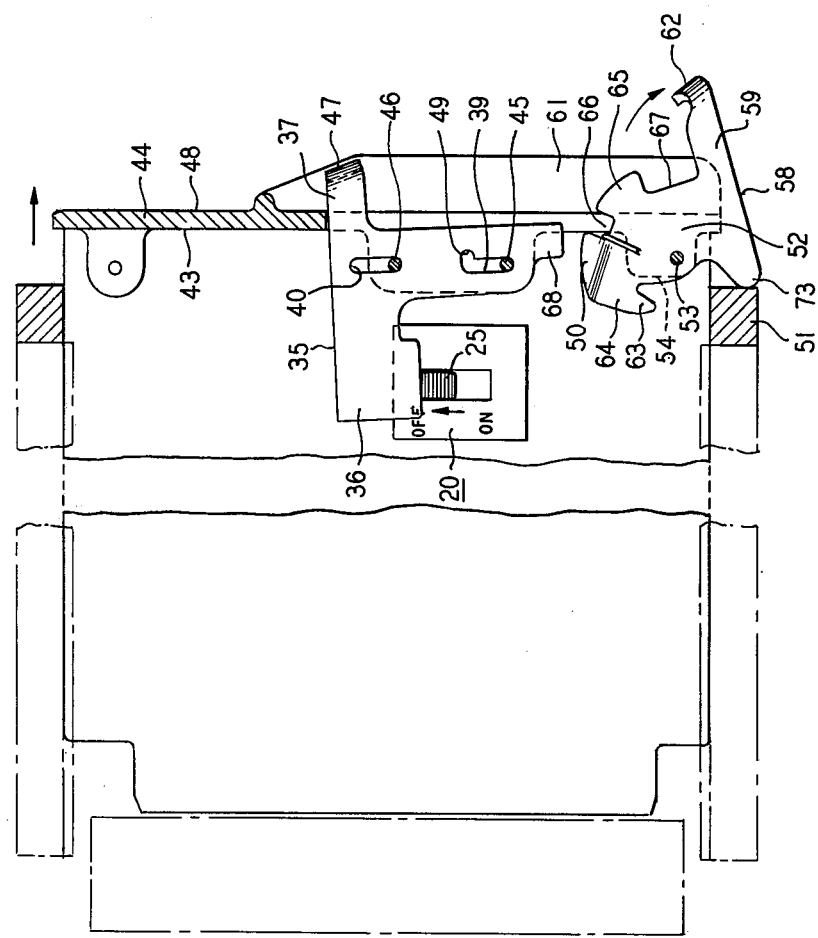
FIG. 6 is a fragmentary side elevation similar to FIG. 5 but with the latch returned and resting on a latch bar.

It should be noted also from FIG. 3 that, when module 10 is inserted into support frame 11, a latch 50 engages a latch bar 51 on support frame 11. Latch 50 is a generally flat, irregular-shaped member which has a central portion 52 with a generally circular aperture 53 therein. This is best illustrated in FIG. 5. Latch 50, as shown in FIG. 2, is pivotally mounted between a pair of projections 54 and 55 on rear face 43 of module face panel 44 by a generally cylindrical pin 56 which passes through aperture 53. Pin 56 has a semispherical cap 57 at one end, the purpose for which will be described subsequently.

Adjacent to central portion 52 of latch 50 is a first edge portion 58 which extends outwardly in opposite directions. An intermediate region 59 of first edge portion 58 is bent outwardly a predetermined distance from a plane containing central portion 52. In the preferred embodiment this distance is, for example, 0.145 inch. Any other distance may be advantageously utilized so long as first edge portion 58 fits between guard projections 60 and 61 on front face 48 of module face panel 44 as shown in FIG. 4.

Near an end of intermediate region 59 there is another bend 62. Bend 62 is generally perpendicular to the plane containing central portion 52 and in a direction generally opposite to the bend direction applied to intermediate region 59. Bend 62 serves as a handle to enable an operator to release latch 50.

Latching of module 10 to support frame 11, as shown in FIG. 3, is effected by a sawtooth-shaped projection 63 on a second edge portion 64 of latch 50. Projection 63 engages a rear surface of latch bar 51. In the latched state a third edge portion 65 of latch 50, which has an arcuate outer edge with notches 66 and 67 therein, is positioned such that a generally rectangular-shaped projection 68 on actuator 35 engages notch 67. A portion of the arcuate edge juxtaposed notch 66 is bent outwardly a predetermined distance from the plane containing central portion 52. In the preferred embodiment this distance, for example, is 0.1 inch. This bend is directed opposite to the bend imparted to intermediate region 59 in first edge portion 58 and limits the extent of arcuate travel of latch 50.

A positional bias which tends to maintain latch 50 in an actuated state is imparted by torsion spring 69. Spring 69 has first and second elongated arms 70 and 71, respectively, about a central portion 72. Semispherical cap 57 on pin 56 holds spring 69 in place on module 10 with arm 70 engaging notch 66 and arm 71 engaging rear face 43 of module face panel 44.

In operation, if switch 20 is in its ON state as module 10 is inserted into support frame 11, second edge portion 64 of latch 50 rides up on latch bar 51 overcoming the positional bias imparted by spring 69. Since projection 68 on actuator 35, when switch 20 is in its ON state, engages notch 67, the arcuate motion imparted to latch 50 in turn imparts a slight arcuate motion to actuator 35. This motion causes detent 49 to shift away from pin 45 releasing actuator 35. At this point the positional bias imparted to switch 20 by spring 30 forces switch 20 into its OFF state. This is shown most clearly in FIG. 6.

Correspondingly, if module 10 is in place in support frame 11 and is to be removed even though switch 20 is in its ON state, the arcuate motion imparted to latch 50 to release it in turn moves actuator 35 slightly counterclockwise. The counterclockwise motion shifts detent 49 away from pin 45 and the switch positional bias returns switch 20 to its OFF state. This is best shown in FIG. 5.

It should be noted that at an opposite end of first end portion 58 of latch 50 there is a generally rounded end face 73. In releasing latch 50, end face 73 engages latch bar 51 in support frame 11. This engagement facilitates the uncoupling of contact pads 14 from connector 15 and aids in the removal of module 10 from support frame 11.

In all cases it is to be understood that the above-described embodiment is illustrative of but a small number of many possible specific embodiments which can represent applications of the principles of the invention. Thus, numerous and various other embodiments can readily be devised in accordance with these principles by those skilled in the art without departing from the spirit and scope of the invention.

What is claimed is:
1. A switch assembly for removing electrical power supplied to an electronic module during insertion and removal of the module with a mating connector on a support frame including
   a switch fixedly mounted to said module and having a slidable member movable from a first position, wherein said switch is in an OFF state preventing electrical power from being supplied to said module, to a second position, wherein said switch is in an ON state permitting electrical power to be supplied to said module,
   means for imparting a positional bias to said switch, said positional bias tending to maintain said switch in its OFF state,
   a generally T-shaped member for overriding said positional bias and actuating said switch when said module is mated with said connector on said support frame, said T-shaped member having a first arm for engaging said slidable member and a second arm having means integral therewith to facilitate imparting a slidable motion to said T-shaped member, said member further having a stem portion which has first and second spaced-apart elongated apertures axially displaced from one another along an axis of said stem for guiding said T-shaped member during said slidable motion, said T-shaped member further including means for holding said switch in its ON state upon actuation,
   first and second pins affixed to said module, said pins slidably engaging said first and second elongated apertures, and
   means, pivotally mounted on said module, for latching said module to said support frame, said latching means including means for engaging said T-shaped member so that upon insertion and removal of said module said latching means is pivotally rotated imparting an arcuate motion to said T-shaped member releasing said holding means and allowing said positional bias to return said switch to its OFF state.

2. The switch assembly in accordance with claim 1 wherein said switch includes
   an insulative support wafer having an elongated aperture in a central region thereof,
   a plurality of electrical contacts fixedly mounted to said support wafer and having provision at one end for electrically coupling said switch to said module,
   a plurality of slide contacts affixed to said slidable member, each of said slide contacts connecting first pairs of said fixedly mounted contacts when said switch is in its OFF state and second pairs of said fixedly mounted contacts when said switch is in its ON state, and
   means for holding said slidable member in slidable engagement with said support wafer, said holding means having provision therein for limiting the travel of said slidable member.

3. The switch assembly in accordance with claim 2 wherein said imparting means includes
   a torsion spring having first and second elongated arms, said first arm engaging said slidable member and said second arm engaging said elongated aperture in said support wafer.

4. The switch assembly in accordance with claim 1 wherein said holding means includes
   a detent at an end of said first elongated aperture juxtaposed said second elongated aperture, said detent engaging said first pin as slidable motion is imparted to said T-shaped member second arm.

5. The switch assembly in accordance with claim 1 wherein said latching means includes
   a generally flat irregular-shaped member having
   a central portion with a generally circular aperture therein,
   a first edge portion extending outwardly from said central portion in opposite directions, an intermediate region of one end of said first edge portion bent outwardly a predetermined distance from a plane containing said central portion and a tip region bent so as to be generally perpendicular to said plane containing said central portion, an opposite end of said first edge portion having a generally rounded end face for engaging said support frame upon rotation of said irregular-shaped member about said aperture,
   a second edge portion having a sawtoothlike shape for engaging said support frame and holding said module therein when said latching means are actuated, and
   a third edge portion having an arcuate outer edge with first and second notches therein, a portion of said arcuate edge juxtaposed said first notch being bent outwardly a predetermined distance from said plane containing said central portion but in a direction opposite to said bent end of said first edge portion, said bent portion limiting the extent of arcuate travel of said irregular-shaped member upon rotation thereof,
   means for pivotally fastening said irregular-shaped member to said module, and
   means for imparting a positional bias to said irregular-shaped member, said positional bias tending to maintain said latching means in an actuated state.

6. The switch assembly in accordance with claim 5 wherein
   said fastening means comprises a generally cylindrical pin having a semispherical cap at one end, and
   said means for imparting a positional bias to said irregular-shaped member comprises a torsion spring having a central portion and first and second elongated arms, said central portion engaging said cylindrical pin, said first arm engaging said first notch and said second arm engaging said module.

7. The switch assembly in accordance with claim 5 wherein said means for engaging said overriding means includes
   a generally rectangular-shaped projection on said stem portion of said generally T-shaped member opposite said first and second arms, and
   said second notch on said arcuate outer edge of said third edge portion of said irregular-shaped member.

8. A switch assembly for removing electrical power supplied to an electronic module during insertion and removal of the module with a mating connector on a support frame including
   a switch fixedly mounted to said module and having a slidable member movable from a first position, wherein said switch is in an OFF state preventing electrical power from being supplied to said module, to a second position, wherein said switch is in an ON state permitting electrical power to be supplied to said module, said switch further having an insulative support wafer with an elongated aperture in a central region thereof,
   a torsion spring for imparting a positional bias to said switch, said positional bias tending to maintain said switch in its OFF state, said torsion spring having first and second elongated arms, said first arm engaging said slidable member and said second arm engaging said elongated aperture in said support wafer,
   a generally T-shaped member for overriding said positional bias and actuating said switch when said module is mated with said connector on said support frame, said T-shaped member having a first arm for engaging said slidable member and a second arm having means integral therewith to facilitate imparting a slidable motion to said T-shaped member, said member further having a stem portion which has first and second spaced-apart elongated apertures axially displaced from one another along an axis of said stem for guiding said T-shaped member during said slidable motion,
   first and second pins affixed to said module, said pins slidably engaging said first and second elongated apertures,
   a detent at an end of said first elongated aperture juxtaposed said second elongated aperture, said detent engaging said first pin as slidable motion is imparted to said T-shaped member second arm and holding said switch in its ON state upon actuation, and
   means, pivotally mounted on said module, for latching said module to said support frame, said latching means including means for engaging said stem of said T-shaped member so that upon insertion and removal of said module said latching means is pivotally rotated imparting an arcuate motion to said T-shaped member, releasing said detent from said first pin and allowing said torsion spring to return said switch to its OFF state.

9. The switch assembly in accordance with claim 8 wherein said latching means includes
   a generally flat irregular-shaped member having
   a central portion with a generally circular aperture therein,
   a first edge portion extending outwardly from said central portion in opposite directions, an intermediate region of one end of said first edge portion bent outwardly a predetermined distance from a plane containing said central portion and a tip region bent so as to be generally perpendicular to said plane containing said central portion, an opposite end of said first edge portion having a generally rounded end face for engaging said support frame upon rotation of said irregular-shaped member about said aperture,
   a second edge portion having a sawtooth-like shape for engaging said support frame and holding said module therein when said latching means are actuated, and
   a third edge portion having an arcuate outer edge with first and second notches therein, a portion of said arcuate edge juxtaposed said first notch being bent outwardly a predetermined distance from said plane containing said central portion but in a direction opposite to said bent end of said first edge portion, said bent portion limiting the extent of arcuate travel of said irregular-shaped member upon rotation thereof,
   means for pivotally fastening said irregular-shaped member to said module, and
   means for imparting a positional bias to said irregular-shaped member, said positional bias tending to maintain said latching means in an actuated state.

10. The switch assembly in accordance with claim 9 wherein
    said fastening means comprises a generally cylindrical pin having a semispherical cap at one end, and
    said means for imparting a positional bias to said irregular-shaped member comprises a torsion spring having a central portion and first and second elongated arms, said central portion engaging said cylindrical pin, said first arm engaging said first notch and said second arm engaging said module.

* * * * *